United States Patent
Hsiao et al.

(10) Patent No.: US 9,130,080 B2
(45) Date of Patent: Sep. 8, 2015

(54) ENCAPSULATION OF BACKSIDE ILLUMINATION PHOTOSENSITIVE DEVICE

(71) Applicant: Industrial Technology Research Institute, Hsinchu (TW)

(72) Inventors: Zhi-Cheng Hsiao, Hsinchu County (TW); Ming-Ji Dai, Hsinchu (TW); Cheng-Ta Ko, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 62 days.

(21) Appl. No.: 13/943,810

(22) Filed: Jul. 17, 2013

(65) Prior Publication Data

US 2014/0291790 A1    Oct. 2, 2014

(30) Foreign Application Priority Data

Apr. 1, 2013  (TW) .............................. 102111720 A

(51) Int. Cl.
  *H01L 31/024*  (2014.01)
  *H01L 27/146*  (2006.01)

(52) U.S. Cl.
  CPC .......... *H01L 31/024* (2013.01); *H01L 27/1464* (2013.01); *H01L 27/1469* (2013.01); *H01L 27/14634* (2013.01); *H01L 27/14636* (2013.01); *H01L 27/14621* (2013.01); *H01L 27/14627* (2013.01)

(58) Field of Classification Search
  CPC .............. H01L 31/024; H01L 27/1464; H01L 27/14627; H01L 27/14621; H01L 27/14636
  USPC ................. 257/432, 447, 443, 228, 774, 698; 438/238
  See application file for complete search history.

(56) References Cited

U.S. PATENT DOCUMENTS 6,677,178 B2    1/2004  Yagi
8,274,124 B2 *  9/2012  Lin et al. ........................ 257/432

(Continued)

FOREIGN PATENT DOCUMENTS

CN    102280459    12/2011
TW    201203525    1/2012

OTHER PUBLICATIONS

Tom Joy, et al., "Development of a Production-Ready, Back-Illuminated CMOS Image Sensor with Small Pixels", IEEE, International Electron Devices Meeting (IEDM), Dec. 10-12, 2007, pp. 1007-1010.
H. Rhodes, et al., "The Mass Production of Second Generation 65 nm BSI CMOS Image Sensors", IISW, 2011, pp. 1-6.
Bedabrata Pain., et al., "Wafer-Level Thinned Monolithic CMOS Imagers in a Bulk-CMOS Technology", IISW, 2007, pp. 158-161.

(Continued)

*Primary Examiner* — Sheng Zhu
(74) *Attorney, Agent, or Firm* — Jianq Chyun IP Office

(57) ABSTRACT

An encapsulation of backside illumination photosensitive device including a circuit sub-mount, a backside illumination photosensitive device, a plurality of conductive terminals, and a heat dissipation structure is provided. The backside illumination photosensitive device includes an interconnection layer and a photosensitive device array, wherein the interconnection layer is located on the circuit sub-mount, and between the photosensitive device array and the circuit sub-mount. The conductive terminals are located between the interconnection layer and the circuit sub-mount to electrically connect the interconnection layer and the circuit sub-mount. The heat dissipation structure is located under the interconnection layer, and the heat dissipation structure and the photosensitive device array are respectively located at two opposite sides of the interconnection layer.

7 Claims, 5 Drawing Sheets

(56) References Cited

U.S. PATENT DOCUMENTS

| | | | |
|---|---|---|---|
| 2002/0026708 A1* | 3/2002 | Kuriyama et al. | 29/840 |
| 2008/0136012 A1* | 6/2008 | Yang et al. | 257/698 |
| 2009/0194798 A1 | 8/2009 | Tai et al. | |
| 2011/0089517 A1* | 4/2011 | Venezia et al. | 257/447 |
| 2011/0140220 A1 | 6/2011 | Marty et al. | |
| 2011/0159631 A1 | 6/2011 | Fu et al. | |
| 2011/0266645 A1 | 11/2011 | Chao | |
| 2012/0154267 A1 | 6/2012 | Albano et al. | |
| 2012/0193741 A1 | 8/2012 | Borthakur et al. | |

OTHER PUBLICATIONS

Dong-Long Lin., et al., "Quantified Temperature Effect in a CMOS Image Sensor", IEEE, Transactions on Electron Devices, vol. 57, No. 2, Feb. 2010, pp. 422-428.

Hakim Zimouche, et al., "Standard Linear CMOS Image Sensor Insensitive to Temperature Variations", IEEE, International NEWCAS Conference (NEWCAS), 2010, Jun. 20-23, 2010, pp. 145-148.

* cited by examiner

ENCAPSULATION OF BACKSIDE ILLUMINATION PHOTOSENSITIVE DEVICE

CROSS-REFERENCE TO RELATED APPLICATION

This application claims the priority benefit of Taiwan application serial no. 102111720, filed on Apr. 1, 2013. The entirety of the above-mentioned patent application is hereby incorporated by reference herein and made a part of this specification.

BACKGROUND

1. Technical Field

The disclosure relates to an encapsulation of illumination photosensitive device. Particularly, the disclosure relates to an encapsulation of backside illumination photosensitive device.

2. Related Art

Along with popularity of multimedia, digital image devices are developed in succession, and an illumination photosensitive device serving as a critical component thereof becomes increasingly important. The illumination photosensitive device is mainly in charge of converting image into electrical signals, and the illumination photosensitive devices generally include charge coupled devices (CCD) and complementary metal oxide semiconductor (CMOS) photosensitive devices, etc.

FIG. 1A is a cross-sectional view of a conventional encapsulation of front illumination photosensitive device. FIG. 1B is a cross-sectional view of a conventional encapsulation of backside illumination photosensitive device (which is also referred to as an encapsulation of backside illuminated type photosensitive device). Referring to FIG. 1A, in the encapsulation of front illumination photosensitive device 100A, an interconnection layer 120 is disposed on a light receiving surface S1 of a photosensitive device array 110, and an optical micro-structure layer 140 and a color filter layer 130 are disposed on the interconnection layer 120. Therefore, besides passing through the optical micro-structure layer 140 and the color filter layer 130, a light beam L has to further pass through the interconnection layer 120 before being received by the photosensitive device array 110. Since metal layers 122 in the interconnection layer 120 may reflect the light beam L to decrease an intensity of the light sensed by the photosensitive device array 110, the conventional encapsulation of front illumination photosensitive device 100A has disadvantages of a low fill factor (which is referred to a ratio between an area in a single pixel capable of receiving the light beam and the whole pixel area) and a low contrast, etc.

Therefore, the encapsulation of backside illumination photosensitive device 100B (shown in FIG. 1B) is provided, in which the interconnection layer 120 is disposed on a back surface S2 (opposite to the light receiving surface S1) of the photosensitive device array 110, and the optical micro-structure layer 140 and the color filter layer 130 are disposed on the light receiving surface S1 of the photosensitive device array 110. Therefore, the light beam L does not pass through the interconnection layer 120 before the light beam L is received by the photosensitive device array 110. In this way, the light beam L is avoided to be reflected by the interconnection layer 120, so as to improve the fill factor and contrast of the encapsulation of backside illumination photosensitive device 100B.

However, the interconnection layer 120 located on the back surface S2 of the encapsulation of backside illumination photosensitive device 100B is generally required to connect with a circuit substrate (not shown). Since the circuit substrate has a poor thermal conductivity, the encapsulation of backside illumination photosensitive device 100B cannot efficiently dissipate heat and leakage current is generated. Accordingly, problems of poor sensitivity, signal interference and uneven imaging are generated.

SUMMARY

The disclosure is directed to an encapsulation of backside illumination photosensitive device, which provides an improved imaging quality by mitigating leakage current.

The disclosure provides an encapsulation of backside illumination photosensitive device including a circuit sub-mount, a backside illumination photosensitive device, a plurality of conductive terminals and a heat dissipation structure. The backside illumination photosensitive device includes an interconnection layer and a photosensitive device array, where the interconnection layer is located on the circuit sub-mount, and located between the photosensitive device array and the circuit sub-mount. The conductive terminals are located between the interconnection layer and the circuit sub-mount to electrically connect the interconnection layer and the circuit sub-mount. The heat dissipation structure is located under the interconnection layer, and the heat dissipation structure and the photosensitive device array are respectively located at two opposite sides of the interconnection layer.

In order to make the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 2:
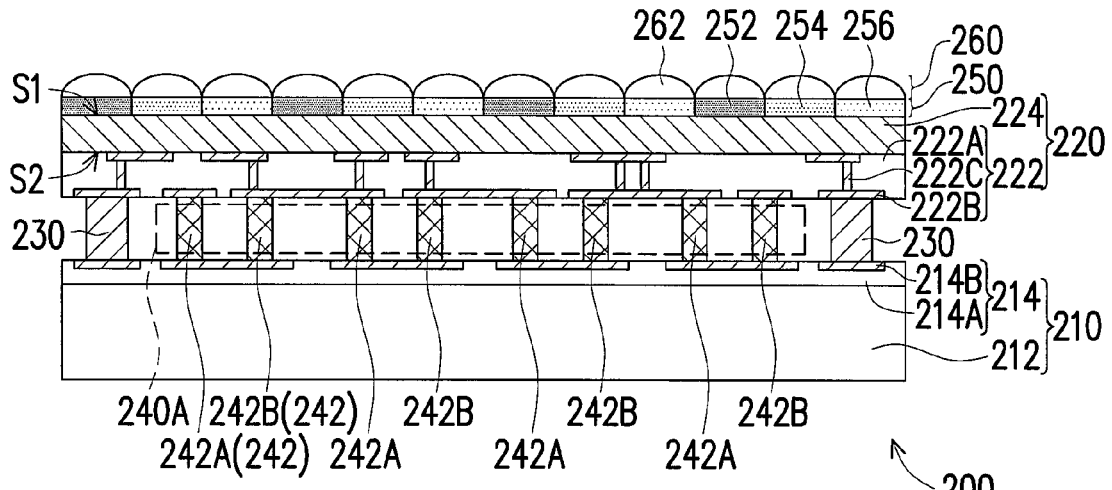
FIG. 2 is a cross-sectional view of an encapsulation of backside illumination photosensitive device according to an embodiment of the disclosure.

FIG. 2 is a cross-sectional view of an encapsulation of backside illumination photosensitive device according to an embodiment of the disclosure. Referring to FIG. 2, the encapsulation of backside illumination photosensitive device 200 of the present embodiment includes a circuit sub-mount 210, a backside illumination photosensitive device 220, a plurality of conductive terminals 230 and a heat dissipation structure 240A.

The circuit sub-mount 210 includes a sub-mount 212 and a circuit layer 214 disposed on the sub-mount 212, where the circuit layer 214, for example, includes a dielectric layer 214A and a plurality of bonding pads 214B distributed in the dielectric layer 214A.

The backside illumination photosensitive device 220 can be a complementary metal oxide semiconductor (CMOS) photosensitive device or a charge coupled device (CCD). Further, the backside illumination photosensitive device 220 includes an interconnection layer 222 and a photosensitive device array 224, wherein the interconnection layer 222 is located on the circuit sub-mount 210 and is located between the photosensitive device array 224 and the circuit sub-mount 210.

The interconnection layer 222 includes a dielectric layer 222A, a plurality of metal layers (including a plurality of bonding pads 222B) and a plurality of inter-layered via plugs 222C, wherein the metal layer and the inter-layered via plug 222C are generally made of a light-shielding conductive material, for example, tungsten, copper, aluminium, aluminium-copper alloy, or aluminium silicon copper alloy, etc.

Figure 1A:
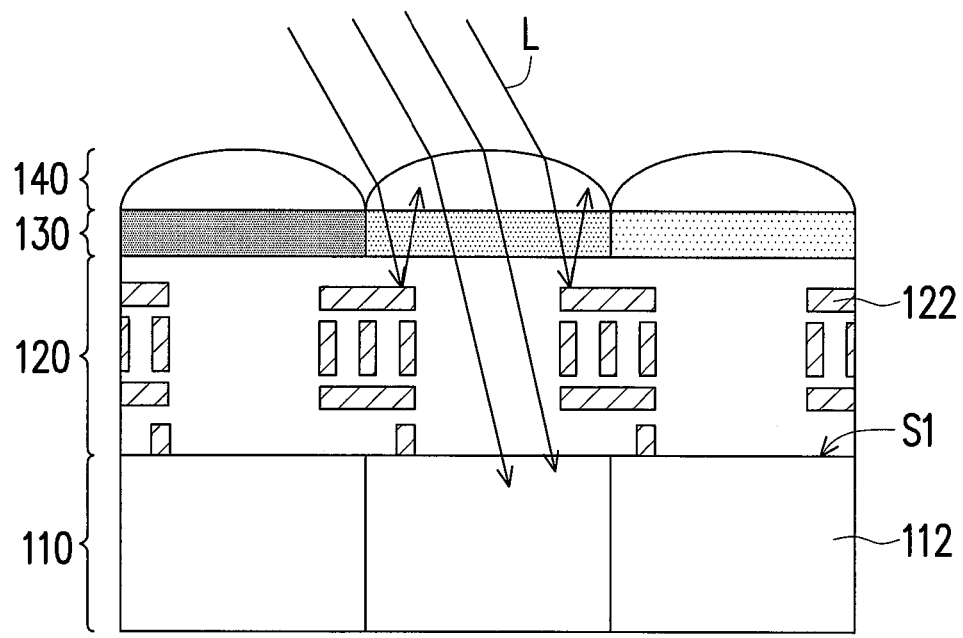
FIG. 1A is a cross-sectional view of a conventional encapsulation of front illumination photosensitive device.
Figure 1B:
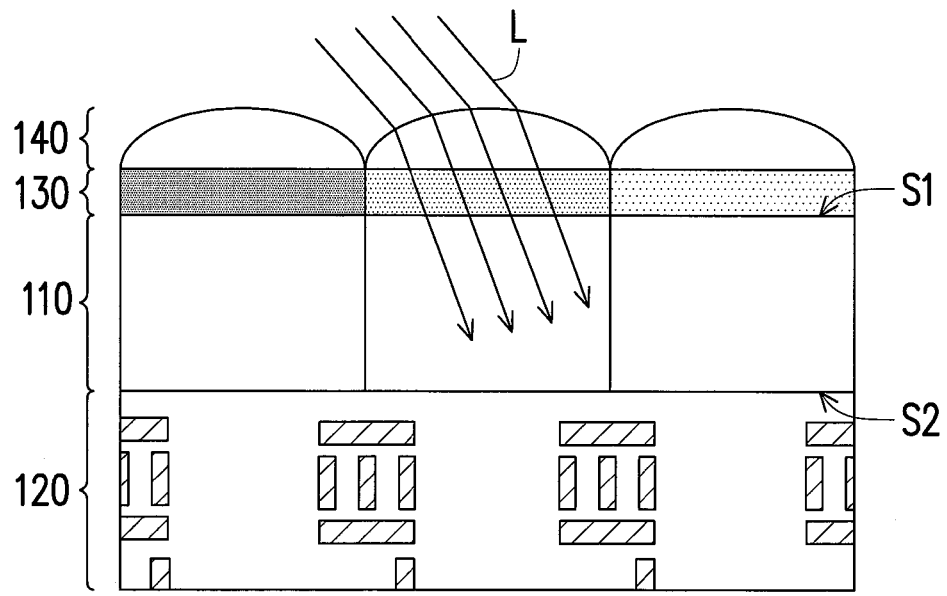
FIG. 1B is a cross-sectional view of a conventional encapsulation of back illumination photosensitive device.

In the conventional encapsulation of front illumination photosensitive device 100A (shown in FIG. 1A), the interconnection layer 120 is disposed on the light receiving surface S1 of the photosensitive device array 110, such that the light beam L has to passes through the interconnection layer 120 before it is received by the photosensitive device 112. Therefore, in order to avoid a situation that a light-shielding film layer (the metal layer 122) in the interconnection layer 120 shields the photosensitive device array 110, a circuit layout in the interconnection layer 120 has to be changed to clear a space above each photosensitive device 112. Comparatively, the interconnection layer 222 of the present embodiment is disposed on the back surface S2 rather than the light receiving surface S1 of the photosensitive device array 224, a better fill factor and contrast can be achieved without changing the circuit layout of the interconnection layer 222.

Referring to FIG. 2, the conductive terminals 230 of the present embodiment are located between the interconnection layer 222 and the circuit sub-mount 210 to electrically connect the interconnection layer 222 and the circuit sub-mount 210. Further, the bonding pads 222B in the interconnection layer 222 can be electrically connected to the bonding pads 214B in the circuit sub-mount 210 corresponding to the bonding pads 222B through the conductive terminals 230.

The heat dissipation structure 240A is located under the interconnection layer 222. The heat dissipation structure 240A and the photosensitive device array 224 are respectively located at two opposite sides of the interconnection layer 222. Since the heat dissipation structure 240A is disposed on the back surface S2 (opposite to the light receiving surface S1) of the photosensitive device array 224, composite polymer heat conductive materials with high light transmittance can be used as the material of the heat dissipation structure 240A. Besides the above-mentioned composite polymer heat conductive materials, the light-shielding materials such as metal and alloy, etc. with good heat conductivity can also be used as the material of the heat dissipation structure 240A.

In the present embodiment, the material of the heat dissipation structure 240A is, for example, a thermoelectric material, though the disclosure is not limited thereto. The thermoelectric material can convert electrical energy and heat energy into each other, for example, bismuth telluride and an alloy thereof, lead telluride and an alloy thereof, and silicon germanium, etc. In this way, by applying a voltage to the heat dissipation structure 240A, the heat generated from the back surface S2 of the photosensitive device array 224 is conducted by the heat dissipation structure 240A, which is the so-called thermoelectric cooling.

Moreover, the heat dissipation structure 240A, for example, includes a plurality of conductive pillars 242 separated from each other, where each of the conductive pillars 242 is connected to the circuit sub-mount 210 and the interconnection layer 222, and is not connected to the conductive terminals 230. Namely, the conductive pillars 242 of the present embodiment are not used for transmitting signals, but are used for dissipating heat.

In the present embodiment, a space between the adjacent conductive pillars 242 and between the conductive pillars 242 and the conductive terminals 230 can be filled with none medium. In this way, besides that the heat dissipation structure 240A is used to conduct the heat generated from the back surface S2 of the photosensitive device array 224 through heat conduction, the heat generated from the back surface S2 of the photosensitive device array 224 can be conducted through heat convection. However, in order to increase structure strength of the whole encapsulation of backside illumination photosensitive device 200, the user can also selectively fill medium between the adjacent conductive pillars 242 and/or between the conductive pillars 242 and the conductive terminals 230.

On the other hand, in order to further increase the heat dissipation efficiency, a plurality of N-type conductive pillars 242A and a plurality of P-type conductive pillars 242B are configured, and the N-type conductive pillars 242A and the P-type conductive pillars 242B are connected in series in alternation through the bonding pads 222B in the interconnection layer 222 and the bonding pads 214B in the circuit sub-mount 210 corresponding to the bonding pads 222B, so as to conduct the heat generated from the back surface S2 of the photosensitive device array 224 efficiently.

In detail, two ends of each conductive pillar 242 are, for example, respectively connected to the bonding pad 222B in the interconnection layer 222 and the bonding pad 214B in the circuit sub-mount 210 (the circuit layer 214) corresponding to the bonding pad 222B, and the adjacent conductive pillars 242 are connected in series through the corresponding bonding pads 214B and 222B so as to form a current flowing path between the interconnection layer 222 and the circuit layer 214. Under such structure, by connecting the N-type conductive pillars 242A and the P-type conductive pillars 242B in series in alternation through the bonding pads 222B in the interconnection layer 222 and the bonding pads 214B in the circuit sub-mount 210, a plurality of PN diodes connected in series are formed. In this way, by applying a voltage, the conductive pillars 242 equivalent to the PN diodes connected in series are conducted to conduct the heat generated from the back surface S2 of the photosensitive device array 224, so as to decrease the signal interference caused by the leakage current generated due to the heat. Accordingly, the encapsulation of backside illumination photosensitive device 200 has improved imaging quality and sensitivity.

It should be noticed that the N-type conductive pillar 242A refers to a conductive pillar doped with a donor dopant (i.e. majority carriers of the N-type conductive pillar 242A are electrons and minority carriers thereof are holes), and P-type conductive pillar 242B refers to a conductive pillar doped with an acceptor dopant (i.e. majority carriers of the P-type conductive pillar 242B are holes and minority carriers thereof are electrons). Here, the materials of the donor dopant and the acceptor dopant are determined by the material of the conductive pillar 242. For example, when the material of the conductive pillar 242 is $Bi_2Te_3$, the N-type conductive pillar 242A can be formed by doping a VI A group element (for example, Se in the $Bi_2Te_3$), and the P-type conductive pillar 242B can be formed by doping a V A group element (for example, Sb in the $Bi_2Te_3$), so as to improve the heat dissipation efficiency.

In the present embodiment, the N-type conductive pillars 242A and the P-type conductive pillars 242b arranged in alternation are taken as an example for descriptions, though the disclosure is not limited thereto. In other embodiments, the circuit layout in the interconnection layer 222 and the arrangement of the N-type conductive pillars 242A and the P-type conductive pillars 242b can be modified according to actual requirements, so as to achieve the same or similar dissipation effect.

Figure 3:
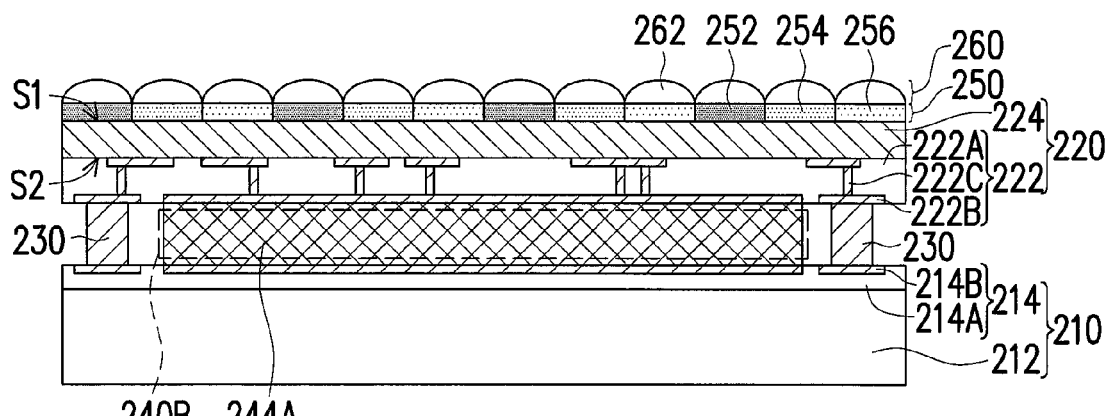
FIG. 3 and FIG. 4 are cross-sectional views of encapsulations of backside illumination photosensitive device according to other embodiments of the disclosure.
Figure 4:
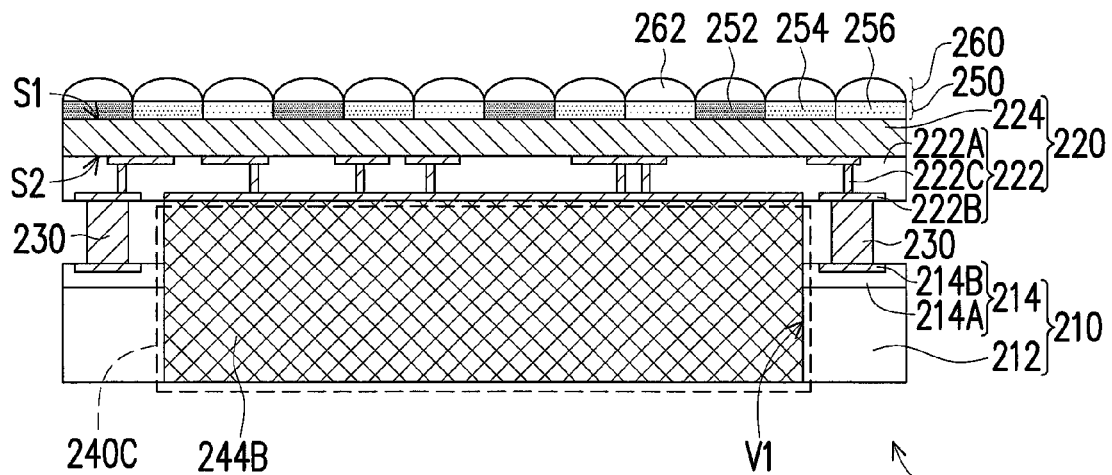

It should be noticed that although a plurality of the conductive pillars 242 are used to describe the implementation of the heat dissipation structure, the heat dissipation structure of the disclosure is not limited thereto. For example, as shown in FIG. 3, the heat dissipation structure 240B can also be a block type heat dissipation pillar 244A connected between the circuit sub-mount 210 and the interconnection layer 222, wherein the material of the heat dissipation pillar 244A can be a composite polymer heat conductive material or metal, alloy, etc. Alternatively, as shown in FIG. 4, a heat dissipation structure 240C can also be a heat dissipation pillar 244B extending from the surface of the interconnection layer 222 to the bottom surface of the circuit sub-mount 210. In detail, the circuit sub-mount 210 may further include a heat dissipation through hole V1, and the heat dissipation pillar 244B extends from the surface of the interconnection layer 222 to the heat dissipation through hole V1. Moreover, in the embodiment illustrated in FIG. 4, an encapsulant (for example, a thermal encapsulant or an insulation encapsulant) is formed between the circuit sub-mount 210 and the heat dissipation pillar 244B to improve reliability of the encapsulation of backside illumination photosensitive device 400.

In the embodiments of FIG. 3 and FIG. 4, by increasing a contact area between the heat dissipation pillars 244A and 244B and the interconnection layer 222, the heat dissipation efficiency is increased so as to decrease the signal interference caused by the leakage current generated due to the heat. Accordingly, the imaging quality and sensitivity of the encapsulation of backside illumination photosensitive devices 300 and 400 are improved.

Moreover, referring to FIG. 2 to FIG. 4, the encapsulation of backside illumination photosensitive devices 200, 300 and 400 may further include a color filter layer 250 and an optical micro-structure layer 260, wherein the color filter layer 250 and the interconnection layer 222 are respectively located at two opposite sides of the photosensitive device array 224, and the optical micro-structure layer 260 and the photosensitive device array 224 are respectively located at two opposite sides of the color filter layer 250.

The color filter layer 250, for example, includes a plurality of color filter patterns 252, 254 and 256, wherein the color filter patterns 252, 254 and 256 are, for example, red, green and blue color filter patterns, though the disclosure is not limited thereto. Further, the color types or the arrangement manner of the filter patterns in the color filter layer 250 may be changed according to actual requirements.

The optical micro-structure layer 260, for example, includes a plurality of micro-lenses 262 arranged in an array, and each of the micro-lenses 262 of the present embodiment is disposed corresponding to one of the color filter patterns 252, 254 and 256, though the disclosure is not limited thereto.

Figure 5A:
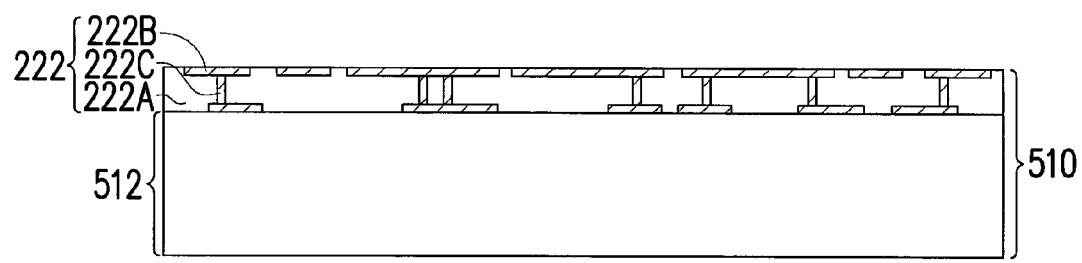
FIG. 5A to FIG. 5G schematically illustrate a method for fabricating an encapsulation of backside illumination photosensitive device according to an embodiment of the disclosure.

FIG. 5A to FIG. 5G are schematic diagrams of a method for fabricating the encapsulation of backside illumination photosensitive device 200 of FIG. 2. Referring to FIG. 5A, a photosensitive device substrate 510 is provided, wherein the photosensitive device substrate 510 includes a substrate 512 having a photosensitive device array formed thereon and the interconnection layer 222. For example, the substrate 512 is a wafer.

Figure 5B:
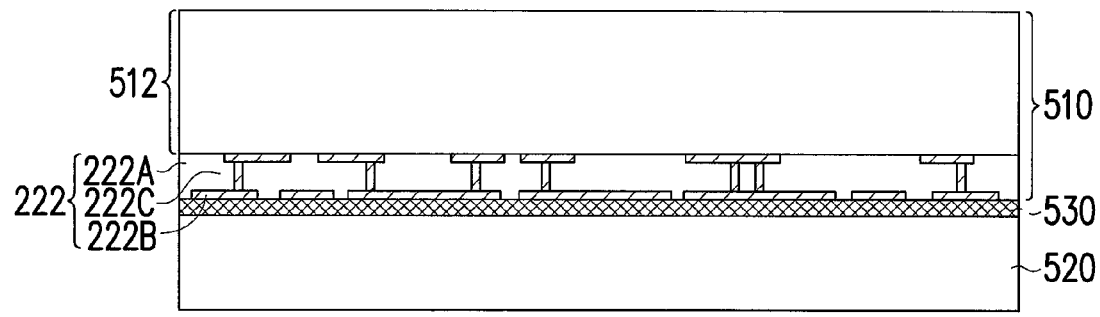

Referring to FIG. 5B, the photosensitive device substrate 510 is bonded to a temporary substrate 520, wherein the interconnection layer 222 is located between the substrate 512 having the photosensitive device array formed thereon and the temporary substrate 520. In the present embodiment, the photosensitive device substrate 510 and the temporary substrate 520 are, for example, bonded through an adhesive layer 530.

Figure 5C:
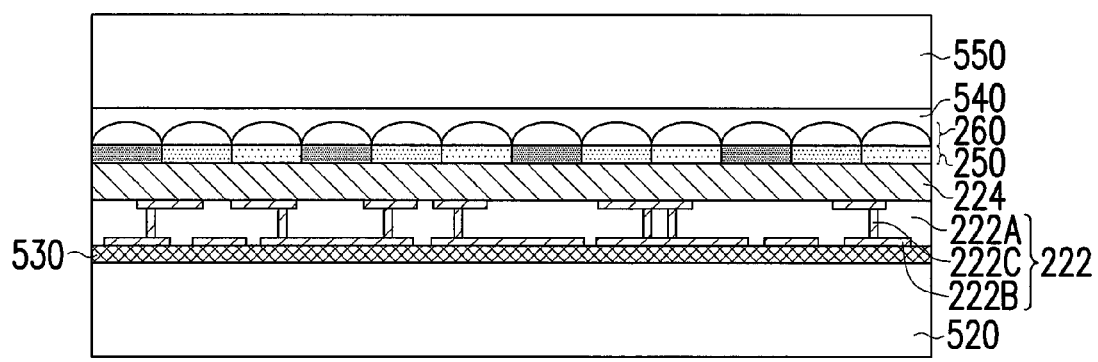

Moreover, the substrate 512 having the photosensitive device array formed thereon can be further thinned such that the photosensitive device array 224 shown in FIG. 2 and FIG. 5C is formed.

Referring to FIG. 5C, the color filter layer 250 and the optical micro-structure layer 260 are sequentially formed on the photosensitive device array 224, and a cover plate 550 is bonded to the optical micro-structure layer 260 through an adhesive layer 540. The cover plate 550 is, for example, a transparent plastic substrate or a transparent tempered glass substrate. In detail, the material of the cover plate 550 can be polymethyl methacrylate (PMMA), acrylic resin or other suitable transparent materials.

Figure 5D:
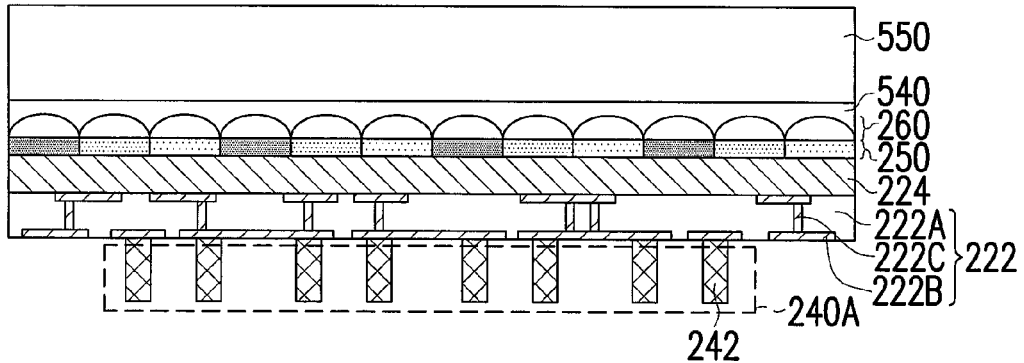

Referring to FIG. 5D, the temporary substrate 520 and the adhesive layer 530 are removed, and the heat dissipation structure 240A is formed under the interconnection layer 222, wherein the heat dissipation structure 240A of the present embodiment, for example, includes a plurality of conductive pillars 242, and each of the conductive pillars 242 is disposed under the corresponding bonding pad 222B in the interconnection layer 222. In the present embodiment, after the temporary substrate 520 and the adhesive layer 530 are removed, the entire structure is upside down to make a process surface (i.e. a surface of the interconnection layer 222 to be formed with the heat dissipation structure 240A) facing upward, and then the heat dissipation structure 240A is fabricated. Therefore, during the fabrication of the heat dissipation structure 240A, the cover plate 550 can not only serve as a substrate for carrying the entire structure, but also protect the optical micro-structure layer 260.

Figure 5E:
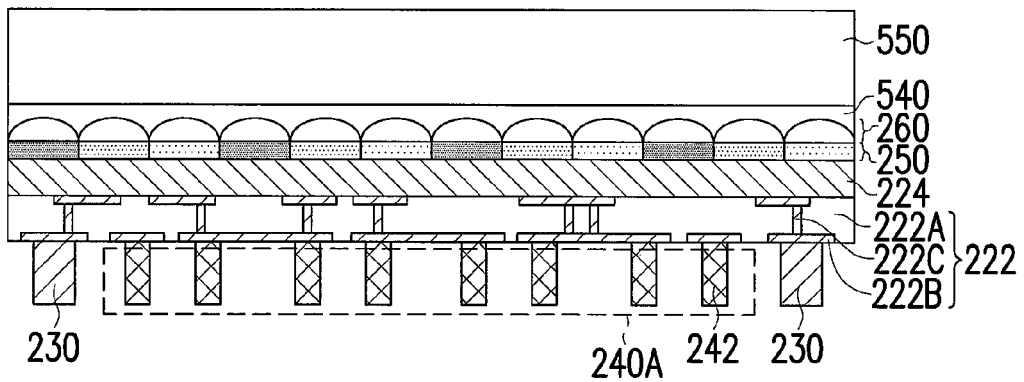

Referring to FIG. 5E, a plurality of conductive terminals 230 are formed under the interconnection layer 222, wherein the conductive terminals 230 are respectively disposed under the corresponding bonding pad 222b (the bonding pads 222B that are not configured with the conductive pillars 242) in the interconnection layer 222.

In the present embodiment, if the material of the aforementioned conductive pillars 242 is the same to the material of the conductive terminals 230 (for example, copper), the conductive pillars 242 and the conductive terminals 230 can be formed simultaneously. However, if the material of the aforementioned conductive pillars 242 is different to the material of the conductive terminals 230 (the material of the conductive pillars 242 is a composite polymer heat conduction material or the aforementioned thermoelectric material), the conductive pillars 242 and the conductive terminals 230 are formed in different steps.

Moreover, if the material of the conductive pillars 242 is the aforementioned thermoelectric material, before the conductive terminals 230 are formed, the aforementioned N-type conductive pillars and the P-type conductive pillars are first formed (by doping different dopants). Moreover, in the step of forming the conductive terminals 230, a layer of tin can be further formed on the conductive terminals 230 and the conductive pillars 242 through electroplating or printing, so as to facilitate subsequently bonding the conductive terminals 230 and the conductive pillars 242 with the circuit sub-mount 210 (shown in FIG. 5F).

Figure 5F:
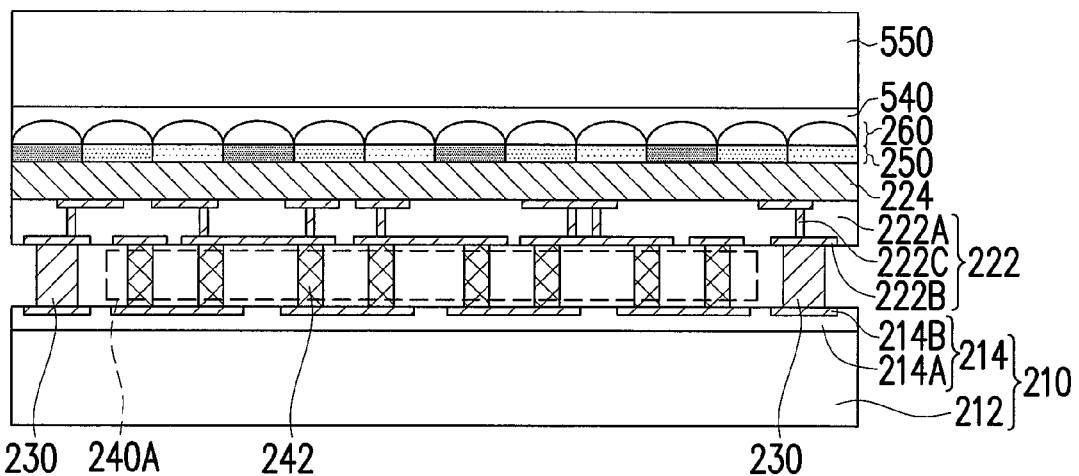

Referring to FIG. 5F, the conductive terminals 230 and the conductive pillars 242 are bonded to the circuit sub-mount 210, wherein a bonding method thereof includes melting the aforementioned tin to bond the conductive terminals 230 and the conductive pillars 242 to the circuit sub-mount 210.

The circuit sub-mount 210 includes the sub-mount 212 and the circuit layer 214 disposed on the sub-mount 212, wherein the circuit layer 214 includes the dielectric layer 214A and a plurality of bonding pads 214B distributed in the dielectric layer 214A. The conductive terminals 230 and the conductive pillars 242 are, for example, connected to the corresponding bonding pads 214B in the dielectric layer 214A. In other words, the conductive terminals 230 and the conductive pillars 242 are respectively connected to the corresponding bonding pads 214B (located in the circuit layer 214 of the circuit sub-mount 210) and the bonding pads 222B (located in the interconnection layer 222). In this way, fabrication of the encapsulation of backside illumination photosensitive device 200 of FIG. 2 is preliminarily completed. It should be noticed that comparing to the encapsulation of backside illumination photosensitive device 200 shown in FIG. 2, the encapsulation of backside illumination photosensitive device shown in FIG. 5F further comprise the adhesive layer 540 and the cover plate 550. However, the above-mentioned elements (i.e. the adhesive layer 540 and the cover plate 550) are not necessary elements of the encapsulation of backside illumination photosensitive device. The adhesive layer 540 and the cover plate 550 can be maintained or removed according to actual requirements.

Figure 5G:
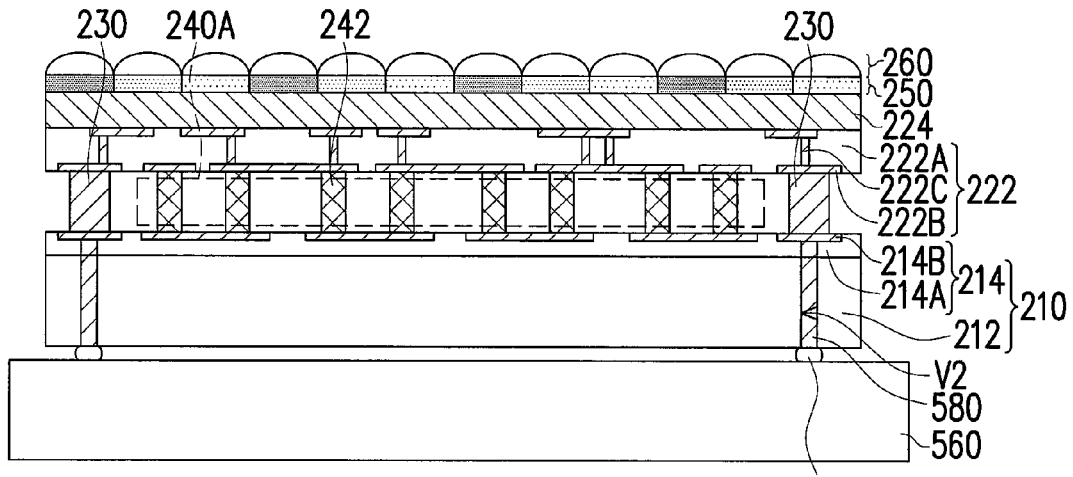

Referring to FIG. 5G, in the present embodiment, a circuit board 560 can be further configured under the encapsulation of backside illumination photosensitive device 200 of FIG. 2. Before the circuit board 560 is configured, a plurality of conductive through holes V2 are formed in the circuit sub-mount 210 at places corresponding to the conductive terminals 230, and a plurality of conductive structures 580 in the conductive through holes V2 are formed. Then, the conductive structures 580 of the circuit sub-mount 210 are connected to the circuit board 560 through bumps 570. In this way, the interconnection layer 222 can be electrically connected to the circuit board 560 through the conductive terminals 230, the conductive structures 580 and the bumps 570. Therefore, after the light received by the photosensitive device array 224 are converted into electrical signals, the electrical signals can be output to the circuit board 560 through the metal layer and the bonding pads 222B in the interconnection layer 222, the conductive terminals 230, the conductive structures 580 and the bumps 570.

Figure 6:
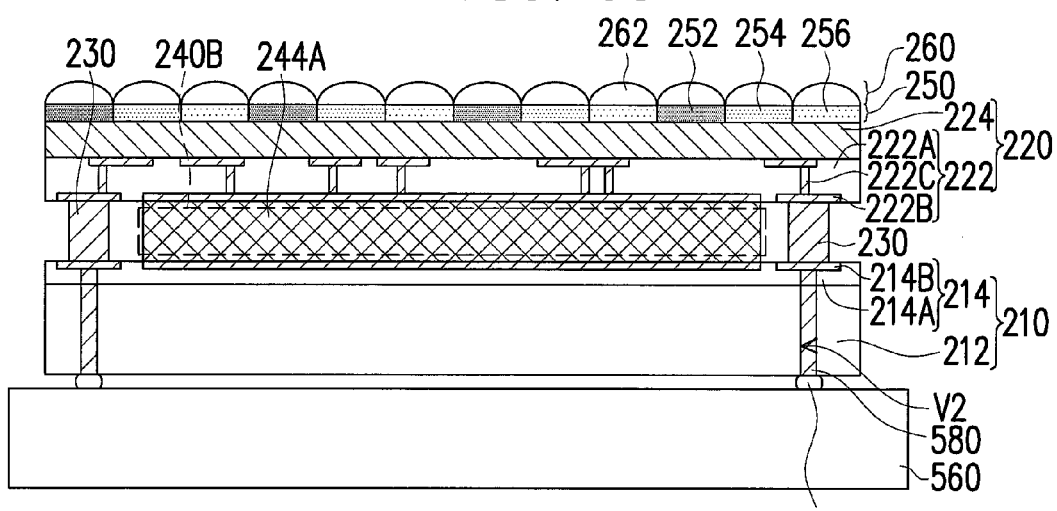
FIG. 6 and FIG. 7 are cross-sectional views of encapsulations of backside illumination photosensitive device according to other embodiments of the disclosure.
Figure 7:
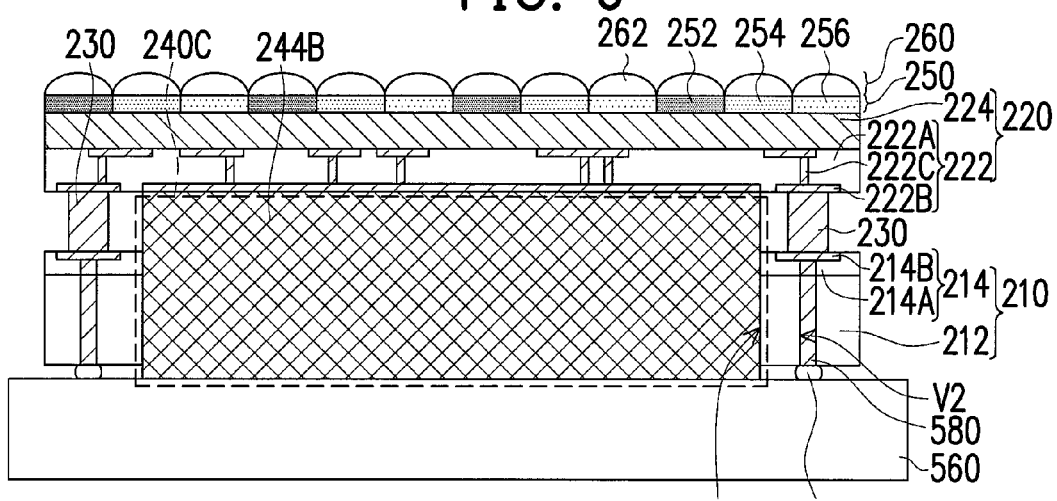

It should be noticed that besides that the fabrication method of FIG. 5A to FIG. 5G is adapted to fabricate the encapsulation of backside illumination photosensitive device 200, the fabrication method of FIG. 5A to FIG. 5G is also adapted to fabricate the encapsulation of backside illumination photosensitive devices 300 and 400. Taking the encapsulation of backside illumination photosensitive device 300 as an example, a fabrication method similar as that shown in FIG. 5A to FIG. 5G can be used to form the structure shown in FIG. 6, and the difference therebetween is that in the step of FIG. 5D, the heat dissipation structure 240B is the block type heat dissipation pillar 244A, and the bonding pads 214B and 224B connected to the heat dissipation pillar 244A can be the bonding pads 214B and 222B. Regarding the encapsulation of backside illumination photosensitive device 400, a fabrication method similar as that shown in FIG. 5A to FIG. 5G can also be used to form the structure shown in FIG. 7, and the difference therebetween is that in the step of FIG. 5D, the heat dissipation structure 240C is the block type heat dissipation pillar 244B, where a thickness of the block type heat dissipation pillar 244B is greater than a thickness of the heat dissipation pillar 244A. Moreover, in the step of FIG. 5F, before the bonding process of the circuit sub-mount 210, the heat dissipation through holes V1 are further formed in the circuit sub-mount 210, and after the bonding process, the heat dissipation pillars are disposed in the heat dissipation through holes V1. Moreover, the user can directly connect the heat dissipation pillars 244$b$ to the circuit board 560 (for example, by adjusting the thickness of the heat dissipation pillars 244B) according to actual requirements. In this way, the heat dissipation efficiency is further improved, and the leakage current generated due to the heat is decreased.

In summary, in the encapsulation of backside illumination photosensitive device of the disclosure, the interconnection layer is disposed on the back surface of the photosensitive device array to resolve the problem of metal layer reflection and the problem of poor light receiving efficiency occurred in front illumination photosensitive device, so as to achieve a better fill factor and contrast. Moreover, in the encapsulation of backside illumination photosensitive device of the disclosure, the heat dissipation structure is disposed under the interconnection layer to conduct the heat generated from the photosensitive device array, so as to mitigate the problem of leakage current caused by poor heat dissipation efficiency. Accordingly, good imaging quality and sensitivity of the encapsulation of backside illumination photosensitive device can be achieved.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An encapsulation of backside illumination photosensitive device, comprising: a circuit sub-mount; a backside illumination photosensitive device, comprising: an interconnection layer located on the circuit sub-mount; a photosensitive device array, wherein the interconnection layer is located between the photosensitive device array and the circuit sub-mount; a plurality of conductive terminals located between the interconnection layer and the circuit sub-mount to electrically connect the interconnection layer and the circuit sub-mount; a heat dissipation structure located under the interconnection layer, wherein the heat dissipation structure and the photosensitive device array are respectively located at two opposite sides of the interconnection layer; and a circuit board, wherein the circuit sub-mount is disposed on the circuit board, and the circuit sub-mount further comprises a plurality of conductive through holes disposed corresponding to the conductive terminals and a plurality of conductive structures located in the conductive through holes, each of the conductive terminals is electrically connected to one of the conductive structures, and the interconnection layer is electrically connected to the circuit board through the conductive terminals and the conductive structures, wherein the interconnection layer includes a dielectric layer, a plurality of metal layers and a plurality of inter-layered via plugs, wherein the metal layers and the inter-layered via plugs are generally made of a light-shielding conductive material.

2. The encapsulation of backside illumination photosensitive device as claimed in claim 1, wherein the backside illumination photosensitive device comprises a complementary metal oxide semiconductor (CMOS) photosensitive device or a charge coupled device (CCD).

3. The encapsulation of backside illumination photosensitive device as claimed in claim 1, wherein the heat dissipation structure includes a plurality of conductive pillars, and each of the conductive pillars is connected to the circuit sub-mount and the interconnection layer.

4. The encapsulation of backside illumination photosensitive device as claimed in claim 3, wherein the conductive pillars comprise a plurality of N-type conductive pillars and a plurality of P-type conductive pillars, and the N-type conductive pillars and the P-type conductive pillars are connected in series in alternation through the interconnection layer and the circuit sub-mount.

5. The encapsulation of backside illumination photosensitive device as claimed in claim 1, wherein the heat dissipation structure comprises a heat dissipation pillar connected to the circuit sub-mount and the interconnection layer.

6. The encapsulation of backside illumination photosensitive device as claimed in claim 5, wherein the circuit sub-mount comprises a heat dissipation through hole, and a heat dissipation pillar extends from a surface of the interconnection layer into the heat dissipation through hole.

7. The encapsulation of backside illumination photosensitive device as claimed in claim 1, further comprising:
 a color filter layer, wherein the color filter layer and the interconnection layer are respectively located at two opposite sides of the photosensitive device array; and
 an optical micro-structure layer, wherein the optical micro-structure layer and the photosensitive device array are respectively located at two opposite sides of the color filter layer.

\* \* \* \* \*